(12) United States Patent
Liu et al.

(10) Patent No.: US 12,309,947 B2
(45) Date of Patent: May 20, 2025

(54) SUPPORT STRUCTURE FOR FLEXIBLE DISPLAY MODULE, AND FLEXIBLE DISPLAY DEVICE

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Xiaolin Liu, Beijing (CN); Tao Wang, Beijing (CN); Yuehan Wei, Beijing (CN)

(73) Assignees: CHENGDU BOE OPTOELECTRONICS TECHNOLOGY CO., LTD., Sichuan (CN); BOE TECHNOLOGY GROUP CO LTD., Beijing (CN)

( * ) Notice: Subject to any disclaimer, the term of this patent is extended or adjusted under 35 U.S.C. 154(b) by 0 days.

(21) Appl. No.: 18/042,101

(22) PCT Filed: Feb. 28, 2022

(86) PCT No.: PCT/CN2022/078403
§ 371 (c)(1),
(2) Date: Feb. 17, 2023

(87) PCT Pub. No.: WO2023/159599
PCT Pub. Date: Aug. 31, 2023

(65) Prior Publication Data
US 2024/0276659 A1    Aug. 15, 2024

(51) Int. Cl.
*H05K 5/00*    (2025.01)
*H05K 5/02*    (2006.01)

(52) U.S. Cl.
CPC .................. *H05K 5/0217* (2013.01)

(58) Field of Classification Search
CPC .......... H05K 5/0217; G09F 9/301; G09F 9/30
See application file for complete search history.

(56) References Cited

U.S. PATENT DOCUMENTS

| 9,615,473 | B2 * | 4/2017 | Kim | ..................... H05K 5/0217 |
| 9,891,725 | B2 * | 2/2018 | Lindblad | ............... G06F 3/0416 |
| 10,424,229 | B2 * | 9/2019 | Kim | ..................... H04M 1/0268 |

(Continued)

FOREIGN PATENT DOCUMENTS

| CN | 103926979 A | 7/2014 |
| CN | 205121417 U | 3/2016 |

(Continued)

*Primary Examiner* — Rockshana D Chowdhury
(74) *Attorney, Agent, or Firm* — XSENSUS LLP

(57) ABSTRACT

A support structure for a flexible display module is provided. The support structure for the flexible display module includes a plurality of brackets and a connecting assembly. The plurality of brackets are sequentially arranged in a first direction, and extend in a second direction, the second direction intersects the first direction. A connecting assembly is connected to two adjacent brackets, so that the two adjacent brackets are capable of rotating with each other in a set plane. The set plane is perpendicular to the second direction. The connecting assembly is configured to limit an included angle formed between the two adjacent brackets to be within a range of a first angle and a second angle, inclusive.

20 Claims, 5 Drawing Sheets

(56) References Cited

U.S. PATENT DOCUMENTS

| | | | | |
|---|---|---|---|---|
| 10,506,726 B2* | 12/2019 | Kang | ............... | G06F 1/1652 |
| 10,950,148 B2* | 3/2021 | Choi | ............... | G04G 21/08 |
| 11,013,130 B2* | 5/2021 | Shin | ............... | H05K 5/0217 |
| 11,127,323 B2* | 9/2021 | Kim | ............... | G06F 1/1652 |
| 11,963,323 B2* | 4/2024 | Zhang | ............... | G09F 9/301 |
| 11,994,913 B2* | 5/2024 | Jin | ............... | G06F 1/1601 |
| 12,035,494 B2* | 7/2024 | Cho | ............... | G06F 1/1652 |
| 12,112,661 B2* | 10/2024 | Morin | ............... | G06F 1/1601 |
| 12,124,298 B2* | 10/2024 | Chun | ............... | G06F 1/1616 |
| 2012/0204453 A1* | 8/2012 | Jung | ............... | G09F 9/301 |
| | | | | 40/517 |
| 2014/0196253 A1 | 7/2014 | Song et al. | | |
| 2016/0058375 A1 | 3/2016 | Rothkopf | | |
| 2016/0231843 A1* | 8/2016 | Kim | ............... | G06F 3/0412 |
| 2017/0156225 A1* | 6/2017 | Heo | ............... | G06F 1/1681 |
| 2017/0359915 A1 | 12/2017 | Yang et al. | | |
| 2018/0059727 A1* | 3/2018 | Seo | ............... | G06F 1/1656 |
| 2018/0275715 A1 | 9/2018 | Park et al. | | |
| 2022/0181222 A1 | 6/2022 | Endo et al. | | |
| 2022/0256020 A1 | 8/2022 | Liu et al. | | |

FOREIGN PATENT DOCUMENTS

| | | |
|---|---|---|
| CN | 105492817 A | 4/2016 |
| CN | 107799010 A | 3/2018 |
| CN | 110502073 A | 11/2019 |
| CN | 111306181 A | 6/2020 |
| CN | 113530960 A | 10/2021 |
| CN | 113539109 A | 10/2021 |
| CN | 113841193 A | 12/2021 |
| WO | 2021/213515 A1 | 10/2021 |

* cited by examiner

SUPPORT STRUCTURE FOR FLEXIBLE DISPLAY MODULE, AND FLEXIBLE DISPLAY DEVICE

CROSS-REFERENCE TO RELATED APPLICATION

This application is a national phase entry under 35 USC 371 of International Patent Application No. PCT/CN2022/078403, filed on Feb. 28, 2022, which is incorporated herein by reference in its entirety.

TECHNICAL FIELD

The present disclosure relates to the technical field of display structures, and in particular, to a support structure for a flexible display module and a flexible display device.

BACKGROUND

With the development of display technologies, the flexible display technology is also continuously promoted. Flexible display devices are favored by consumers due to their advantages such as flexibility and portability, and become one of the important development trends of display devices in future.

SUMMARY

In an aspect, a support structure for a flexible display module is provided. The support structure for the flexible display module includes a plurality of brackets and at least one connecting assembly. The plurality of brackets are sequentially arranged in a first direction, the plurality of brackets each extend in a second direction, and the second direction intersects the first direction. A connecting assembly is connected to two adjacent brackets, so that the two adjacent brackets are capable of rotating with each other in a set plane. The set plane is perpendicular to the second direction. The connecting assembly is configured to limit an included angle formed between the two adjacent brackets to be within a range of a first angle and a second angle, inclusive.

Support surfaces of the plurality of brackets are capable of supporting the flexible display module; in a case where the included angle formed between the two adjacent brackets is at the first angle, the support surfaces of the plurality of brackets are capable of limiting a display surface of the flexible display module to be a flat surface; and in a case where the included angle formed between the two adjacent brackets is at the second angle, the support surfaces of the plurality of brackets are capable of limiting the display surface of the flexible display module to be a curved surface.

In some embodiments, the brackets each include a main body structure and a connecting structure extending from the main body structure to a side of the main body structure away from the support surfaces. The connecting assembly is connected to connecting structures of the two adjacent brackets.

In some embodiments, the connecting structure includes a first connecting portion and a second connecting portion connected to each other, and the first connecting portion and the second connecting portion are arranged in a misaligned manner in the first direction. The first connecting portion is used for connecting a second connecting portion in one bracket adjacent thereto, and the second connecting portion is used for connecting to a first connecting portion in another bracket adjacent thereto.

In some embodiments, the first connection portion and the second connection portion are arranged in a misaligned manner in the second direction. First connecting portions of the plurality of brackets are arranged in the first direction, and second connecting portions of the plurality of brackets are arranged in the first direction.

In some embodiments, one of the first connecting portion and the second connecting portion has a through hole, and another one of the first connecting portion and the second connecting portion has a position-limiting hole. The connecting assembly includes a pin, and the pin passes through a through hole in one bracket and extends into a position-limiting hole in another bracket, so that the two adjacent brackets are connected.

In some embodiments, the position-limiting hole is an arc-shaped hole. The pin is capable of moving to a first end of the arc-shaped hole to make the included angle formed between the two adjacent brackets be at the first angle; and the pin is further capable of moving to a second end of the arc-shaped hole to make the included angle formed between the two adjacent brackets be at the second angle.

In some embodiments, the connecting assembly includes an elastic member. The elastic member is located between the two adjacent brackets, and two ends of the elastic member arranged facing away from each other are connected to two connecting structures, respectively, the two connecting structures being connected to the same connecting assembly and belonging to the two brackets.

In some embodiments, the two first connecting portions connected to the same connecting assembly and belonging to the two brackets are oppositely arranged; a first connecting portion in the two first connecting portions has a groove. An end in the two ends of the elastic member extends into the groove.

In some embodiments, the second connecting portion protrudes outward from the main body structure.

In some embodiments, the first connecting portion includes a first contact portion and a second contact portion extending from the first contact portion to a side of the first contact portion away from the support surfaces. A dimension of a portion of the second contact portion in the first direction is inversely proportional to a distance between the portion of the second contact portion and the first contact portion.

In some embodiments, surfaces of the first contact portion at both ends in the first direction are arc-shaped surfaces.

In some embodiments, an angle difference between the first angle and the second angle is less than or equal to 30°.

In another aspect, a flexible display device is provided. The display device includes the support structure and the flexible display module described above. The flexible display module is installed on the support surfaces of the plurality of brackets of the support structure.

In some embodiments, the flexible display device further includes a flexible battery. The flexible battery is disposed on a side of the support structure away from the flexible display module, and is electrically connected to the flexible display module. The flexible battery includes a connecting plate and a plurality of battery blocks installed on the connecting plate; the plurality of battery blocks are sequentially arranged at intervals in the first direction, and the plurality of battery blocks are connected in series by the connecting plate.

In some embodiments, the flexible battery is located inside the support structure, and is capable of being bent or flattened synchronously along with the support structure.

In some embodiments, the flexible display device further includes an integrated circuit board. The integrated circuit board is located inside a bracket in the plurality of brackets of the support structure and electrically connected to the flexible display module.

In some embodiments, the flexible display device further includes a spacer. The spacer is located between the flexible display module and the support structure, so as to provide a smooth support surface for the flexible display module.

In some embodiments, the spacer is provided with a plurality of openings penetrating the spacer.

In some embodiments, the flexible display device further includes a housing. The housing includes a plurality of housing frames arranged at intervals in the first direction, the plurality of housing frames are correspondingly connected to the plurality of brackets. The housing is capable of being flattened or bent synchronously along with the support structure.

In some embodiments, a housing frame in the plurality of housing frames includes a housing plate, and a third connecting portion extending from the housing plate to a side of the housing plate proximate to the support structure. The third connecting portion has one of a slot and a buckle, and an outer wall of a corresponding bracket has another one of the slot and the buckle; the third connecting portion and the bracket are connected in a snap-fit manner.

BRIEF DESCRIPTION OF THE DRAWINGS

In order to describe technical solutions in the present disclosure more clearly, accompanying drawings to be used in some embodiments of the present disclosure will be introduced briefly below. Obviously, the accompanying drawings to be described below are merely accompanying drawings of some embodiments of the present disclosure, and a person of ordinary skill in the art can obtain other drawings according to these drawings. In addition, the accompanying drawings to be described below may be regarded as schematic diagrams, but are not limitations on actual sizes of products, actual processes of methods and actual timings of signals involved in the embodiments of the present disclosure.

DETAILED DESCRIPTION

Figure 1:
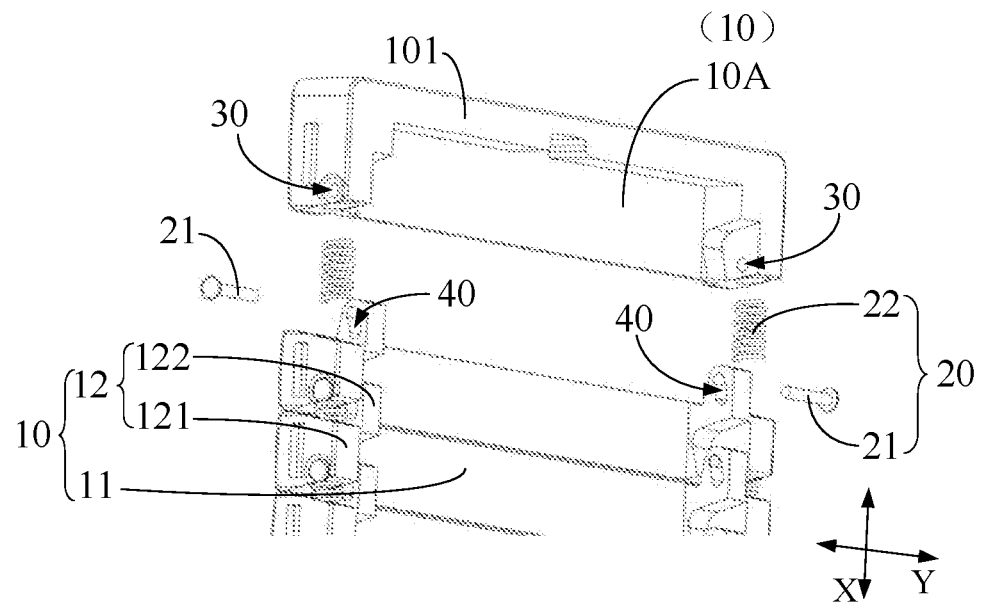
FIG. 1 is a partially exploded structural diagram of a support structure for a flexible display module, in accordance with some embodiments.

Technical solutions in some embodiments of the present disclosure will be described clearly and completely below with reference to the accompanying drawings. Obviously, the described embodiments are merely some but not all embodiments of the present disclosure. All other embodiments obtained by a person of ordinary skill in the art based on the embodiments of the present disclosure shall be included in the protection scope of the present disclosure.

Unless the context requires otherwise, throughout the description and the claims, the term "comprise" and other forms thereof such as the third-person singular form "comprises" and the present participle form "comprising" are construed as an open and inclusive meaning, i.e., "including, but not limited to". In the description of the specification, the terms such as "one embodiment", "some embodiments", "exemplary embodiments", "example", "specific example" or "some examples" are intended to indicate that specific features, structures, materials or characteristics related to the embodiment(s) or example(s) are included in at least one embodiment or example of the present disclosure. Schematic representations of the above terms do not necessarily refer to the same embodiment(s) or example(s). In addition, the specific features, structures, materials, or characteristics may be included in any one or more embodiments or examples in any suitable manner.

Hereinafter, the terms such as "first" and "second" are used for descriptive purposes only, and are not to be construed as indicating or implying the relative importance or implicitly indicating the number of indicated technical features. Thus, a feature defined with "first" or "second" may explicitly or implicitly include one or more of the features. In the description of the embodiments of the present disclosure, the terms "a plurality of", "the plurality of" and "multiple" each mean two or more unless otherwise specified.

In the description of some embodiments, the terms such as "coupled" and "connected" and derivatives thereof may be used. For example, the term "connected" may be used in the description of some embodiments to indicate that two or more components are in direct physical or electrical contact with each other. As another example, the term "coupled" may be used in the description of some embodiments to indicate that two or more components are in direct physical or electrical contact. However, the term "coupled" or "communicatively coupled" may also mean that two or more components are not in direct contact with each other, but still cooperate or interact with each other. The embodiments disclosed herein are not necessarily limited to the context herein.

The phrase "at least one of A, B and C" has the same meaning as the phrase "at least one of A, B or C", and they both include the following combinations of A, B and C: only A, only B, only C, a combination of A and B, a combination of A and C, a combination of B and C, and a combination of A, B and C.

The phrase "A and/or B" includes the following three combinations: only A, only B, and a combination of A and B.

As used herein, depending on the context, the term "if" is optionally construed as "when", "in a case where", "in response to determining" or "in response to detecting". Similarly, depending on the context, the phrase "if it is determined" or "if [a stated condition or event] is detected" is optionally construed as "in a case where it is determined", "in response to determining", "in a case where [the stated condition or event] is detected" or "in response to detecting [the stated condition or event]".

The phrase "applicable to" or "configured to" used herein means an open and inclusive expression, which does not exclude devices that are applicable to or configured to perform additional tasks or steps.

In addition, the phrase "based on" used is meant to be open and inclusive, since a process, step, calculation or other action that is "based on" one or more of the stated conditions or values may, in practice, be based on additional conditions or value exceeding those stated.

As used herein, terms such as "about" or "substantially" as used herein includes a stated value and an average value within an acceptable range of deviation of a particular value. The acceptable range of deviation is determined by a person of ordinary skill in the art in view of the measurement in question and the errors associated with the measurement of a particular quantity (i.e., the limitation of the measurement system).

Exemplary embodiments are described herein with reference to sectional views and/or plan views as idealized exemplary drawings. In the accompanying drawings, thickness of layers and sizes of regions are enlarged for clarity. Variations in shapes relative to the accompanying drawings due to, for example, manufacturing technologies and/or tolerances may be envisaged. Therefore, the exemplary embodiments should not be construed as being limited to the shapes of the regions shown herein, but including shape deviations due to, for example, manufacturing. For example, an etched region shown to have a rectangular shape generally has a feature of being curved. Therefore, the regions shown in the accompanying drawings are schematic in nature, and their shapes are not intended to show actual shapes of regions of a device, and are not intended to limit the scope of the exemplary embodiments.

A flexible display device cannot be used well in states of being flattened and bent. For example, in a case where the flexible display device is bent, excessive bending is easy to occur, which results in the flexible display module being damaged due to excessive bending; in a case where the flexible display device is flattened, it is easy to be bent reversely, which results in the flexible display module being damaged by extrusion. The two cases may cause a problem of abnormal display of the flexible display device.

Figure 2:
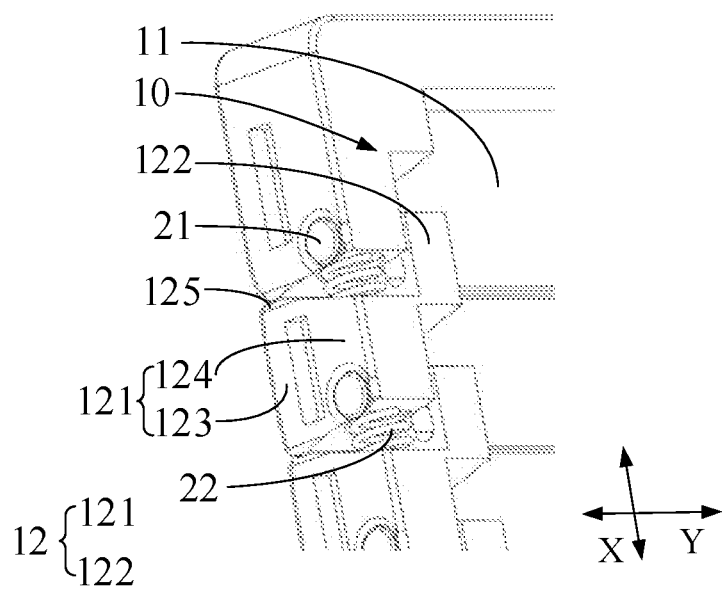
FIG. 2 is a structural diagram of a support structure for a flexible display module, in which an included angle between two adjacent brackets of the support structure is at a first angle, in accordance with some embodiments.
Figure 3:
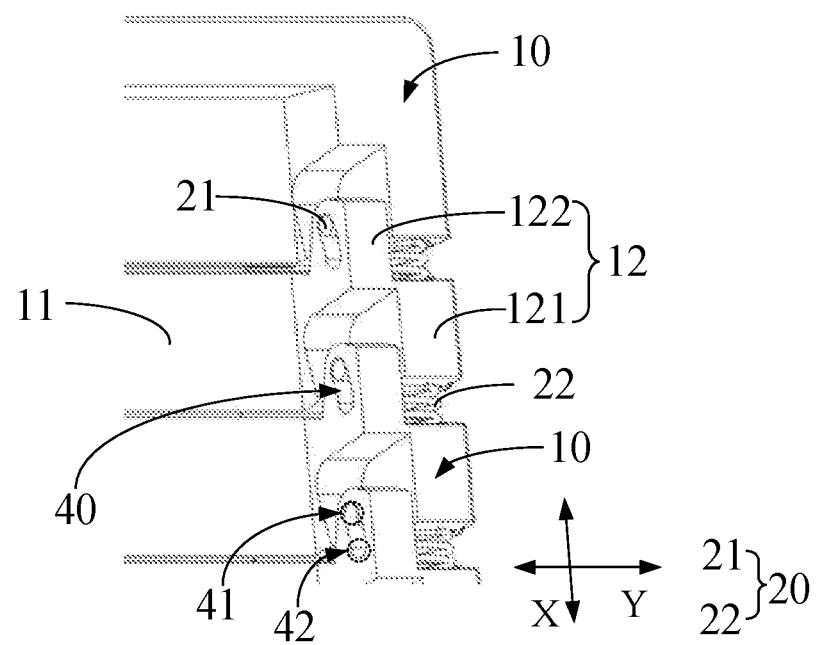
FIG. 3 is another structural diagram of a support structure for a flexible display module, in which an included angle between two adjacent brackets of the support structure is at a first angle, in accordance with some embodiments.
Figure 4:
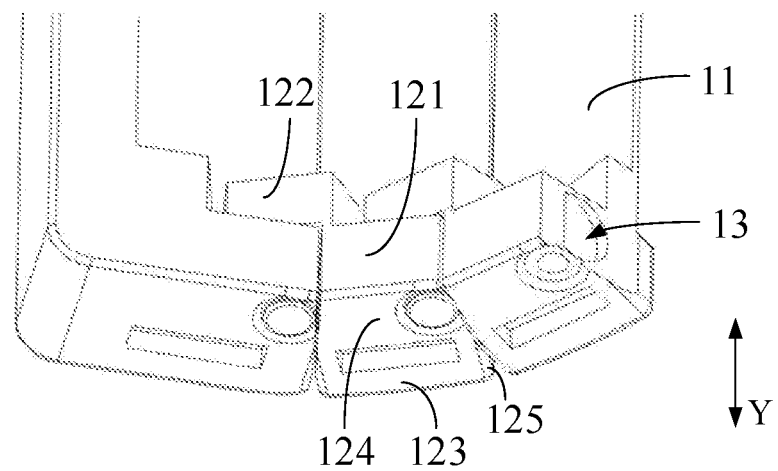
FIG. 4 is a structural diagram of a support structure for a flexible display module, in which an included angle between two adjacent brackets of the support structure is at a second angle, in accordance with some embodiments.

Based on this, referring to FIGS. 1 to 4, FIG. 1 is a partially exploded structural diagram of a support structure for a flexible display module, in accordance with some embodiments; FIG. 2 is a structural diagram of the support structure for the flexible display module, in which an included angle between two adjacent brackets of the support structure is at a first angle, in accordance with some embodiments; FIG. 3 is another structural diagram of the support structure for the flexible display module, in which the included angle between the two adjacent brackets is at the first angle, in accordance with some embodiments; and FIG. 4 is a structural diagram of the support structure for the flexible display module, in which the included angle between two adjacent brackets is at a second angle, in accordance with some embodiments. Some embodiments of the present disclosure provide the support structure 100 for the flexible display module. The support structure 100 for the flexible display module includes a plurality of brackets 10 and connecting assembly(ies) 20. The plurality of brackets 10 are sequentially arranged in a first direction X, and each bracket 10 extends in a second direction Y. The second direction Y intersects the first direction X. One connecting assembly 20 connects two adjacent brackets 10, so that the two adjacent brackets 10 can rotate in a set plane. The set plane is perpendicular to the second direction Y. The connecting assembly 20 is configured to limit an included angle formed between two adjacent brackets 10 to be within a range of the first angle and the second angle, inclusive.

As shown in FIGS. 5A to 5D and 6, support surfaces of the plurality of brackets 10 can support the flexible display module 200. In a case where the included angle α formed between the two adjacent brackets 10 is at the first angle, the support surfaces of the plurality of brackets 10 can limit a display surface of the flexible display module to be a flat surface. In a case where the included angle α formed between the two adjacent brackets 10 is at the second angle, the support surfaces of the plurality of brackets 10 can limit the display surface of the flexible display module 200 to be a curved surface.

As shown in FIGS. 1 to 3, the first direction X intersects the second direction Y, which means that the first direction X is not parallel to the second direction Y. In some examples, the first direction X is substantially perpendicular to the second direction Y. That is, an included angle between a straight line parallel to the first direction X and a straight line parallel to the second direction is substantially equal to 90°, such as 85°, 86.8°, 88°, 90°, 91.2°, 93.1° or 95°.

The number of brackets 10 may be 3, 5, 7, 8, 9, 10, 12 or more, which is not limited here. The bracket 10 may include a bar-shaped structure extending in the second direction Y, and extension lengths of the plurality of brackets 10 in the second direction Y may be equal.

The support surface of the bracket 10 is a surface of the bracket 10 proximate to the flexible display module 200. The support surface of the bracket 10 can provide a support force for the flexible display module 200. The support surface may be a flat surface, in the case where the included angle between two adjacent brackets 10 is at the first angle, the support surfaces may be in a same plane, so as to provide support when the flexible display module 200 is flattened, and in the case where the included angle between two adjacent brackets 10 is at the second angle, the support surfaces may be parallel to tangent planes of a curved surface at different positions. The support surface may also be a curved surface, in the case where the included angle between two adjacent brackets 10 is at the second angle, the support surfaces may be in a same curved surface, so as to provide support when the flexible display module 200 is bent, and in the case where the included angle between two adjacent brackets 10 is at the first angle, tops of the support surfaces are located in a same plane.

There may be three types of brackets 10, and the three types of brackets 10 is, for example, a top bracket 10A in the first direction X, a bottom bracket (not shown in the figure) in the first direction X, and brackets 10 located between the top bracket 10A and the bottom bracket. The top bracket 10A is connected to a bracket 10 through a connecting assembly 20, and the bottom bracket is connected to a bracket 10 through a connecting assembly 20. A bracket 10 is connected to two brackets 10 adjacent thereto through connecting assemblies 20.

As shown in FIG. 1, in some examples, the top bracket 10A may be provided with a top frame 101, and the bottom bracket may be provided with a bottom frame. The top frame

101 and the bottom frame are oppositely arranged, and form an accommodating cavity together with the brackets 10.

Dimensions of the plurality of brackets 10 in the first direction X may be the same or different. For example, in the first direction X, a dimension of each of five brackets 10 is different from dimensions of other four brackets 10 in the five brackets 10. As another example, in the first direction X, dimensions of four brackets 10 in the five brackets 10 are the same, and are different from a dimension of another bracket 10 in the five brackets 10.

The number of the connecting assemblies 20 may be multiple, such as 6, 8, 10, 12, 16, 20 or more, which is not limited here. One connecting assembly 20 is connected to two adjacent brackets 10. However, two adjacent brackets 10 may be connected through one connecting assembly 20, two connecting assemblies 20, or other number of connecting assemblies 20, which is not limited here.

In some examples, two adjacent brackets 10 are connected through one connecting assembly 20, and thus the number of connecting assemblies 20 may be the number of brackets 10 minus one. For example, seven brackets 10 are connected through six connecting assemblies 20.

As shown in FIG. 1, in some examples, two adjacent brackets 10 are connected through two connecting assemblies 20, and thus the number of connecting assemblies 20 may be twice the difference of the number of brackets 10 minus one. For example, six brackets 10 are connected through ten connecting assemblies 20.

In some examples, two connecting assemblies 20 are connected to the same two brackets 10, so that the two brackets 10 are connected through the two connecting assemblies 20. On a basis of the examples, in a case where a bracket 10 is connected to other two brackets 10, the bracket 10 may be connected to two brackets 10 adjacent thereto through four connecting assemblies 20. That is, the bracket 10 is connected to one bracket 10 adjacent thereto through two connecting assemblies 20, and is connected to another one bracket 10 adjacent thereto through other two connecting assemblies.

After the brackets 10 are connected through the connecting assemblies 20, the brackets 10 may rotate in the set plane. For example, the connecting assembly 20 includes a rotating shaft parallel to the second direction Y, and the bracket 10 rotates in the set plane with the rotating shaft as a center. Rotation shafts of connecting assemblies 20 connecting to the same two brackets 10 may all be in a straight line.

As shown in FIGS. 5A to 5D, the included angle α formed between two brackets 10 may be an included angle α formed between support surfaces 14 of the two brackets 10. Considering an example in which the support surfaces 14 are flat surfaces, the included angle α formed between the two support surfaces 14 is an included angle α formed by planes in which the two support surfaces 14 are located. Considering an example in which the support surfaces are curved surfaces, the included angle α formed between the two support surfaces 14 is an included angle α formed by tangent planes 15, in which central points of the two support surfaces 14 are located, of the two support surfaces 14.

Figure 5A:
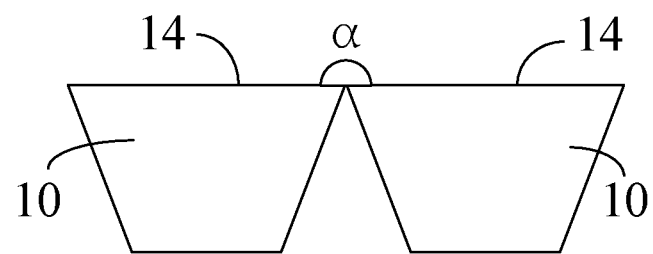
FIGS. 5A to 5D each are an explanatory diagram of an included angle between two connected brackets, in accordance with some embodiments.
Figure 5B:
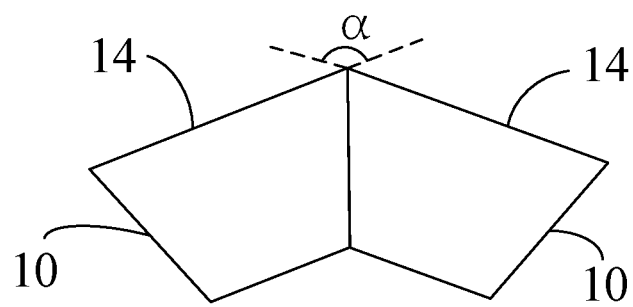

Considering the example in which the support surfaces are flat surfaces, as shown in FIG. 5A, in the case where the included angle α is at the first angle, the support surfaces 14 of the two adjacent brackets 10 may be in the same plane, and thus the included angel α is 180° (that is, the first angle is 180°). In this case, the display surface of the flexible display module 200 installed on the support surfaces 14 of the plurality of brackets 10 is a flat surface. Considering the example in which the support surfaces are flat surfaces, as shown in FIG. 5B, in the case where the included angle α is at the second angle, the support surfaces of two adjacent brackets 10 are located in two planes. In this case, the included angle α is an included angle between the two planes. That is, the second angle is less than 180°, such as 178°, 175°, 170°, 169°, 164°, 160°, 155° or 150°. In this case, the display surface of the flexible display module 200 installed on the support surfaces 14 of the plurality of brackets 10 is a curved surface.

Figure 5C:
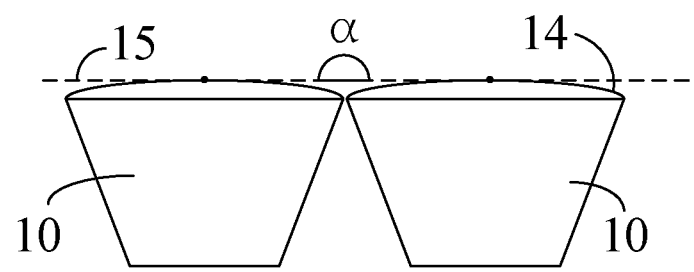
Figure 5D:
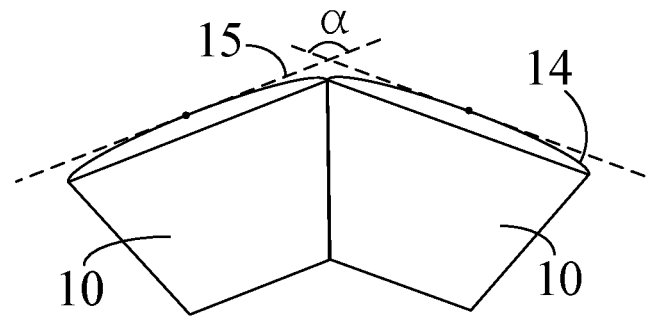

Considering the example in which the support surfaces are curved surfaces, as shown in FIG. 5C, in the case where the included angle α is at the first angle, the tangent planes 15, in which the central points of the support surfaces 14 of the two adjacent brackets 10 are located, of the support surfaces 14 may be in the same plane, and thus the included angle α is 180° (that is, the first angle is 180°). In this case, the display surface of the flexible display module 200 installed on the support surfaces of the plurality of brackets 10 is the flat surface. Considering the example in which the support surfaces are curved surfaces, as shown in FIG. 5D, in the case where the included angle α is at the second angle, the tangent planes 15, in which the central points of the support surfaces 14 of the two adjacent brackets 10 are located, of the support surfaces 14 are in two planes. In this case, the included angle α is an included angle between the two planes. That is, the second angle is less than 180°, such as 178°, 175°, 170°, 169°, 164°, 160°, 155° or 150°. In this case, the display surface of the flexible display module 200 installed on the support surfaces of the plurality of brackets 10 is the curved surface.

In some embodiments, an angle difference between the first angle and the second angle is less than or equal to 30°. For example, the angle difference between the first angle and the second angle is 30°, 28.6°, 21°, 18°, 16.3°, 15°, 14°, 13°, 10°, 8°, 5° or 1°.

It will be noted that, in the case where the included angle α formed between two adjacent brackets is at the second angle, a radian of the curved display surface of the flexible display module 200 is less than or equal to a limit radian of the flexible display module 200. The limit radian of the flexible display module 200 refers to a radian that the flexible display module 200 has for being bent to the maximum extent in a condition where the normal display function is satisfied. In the case where the radian of the curved display surface of the flexible display module 200 is greater than the limit radian, display structures of the flexible display module 200 may be damaged, which results in abnormal display. In a case where the radian of the curved display surface of the flexible display module 200 is less than or equal to the limit radian of the flexible display module 200, the flexible display module 200 can perform display normally.

For the support structure for the flexible display module provided in the embodiments of the present disclosure, the plurality of brackets 10 may rotate with each other through the connecting assemblies 20, and thus the flexible display module 200 is driven to be flattened or bent. The connecting assembly 20 may limit the included angle α formed between two adjacent brackets 10 to be within the range of the first angle and the second angle, inclusive. Therefore, it is possible to avoid the situation that the structures of the flexible display module 200 are damaged due to the flexible display module 200 being reversely bent and the situation that the flexible display module is damaged due to the flexible display module 200 being excessively bent, thereby ensuring that the flexible display module 200 can perform display normally in both the states of being flattened and bent, and improving the reliability of a flexible display device.

As shown in FIGS. 1 to 3, in some embodiments, the bracket 10 includes a main body structure 11 and connecting structure(s) 12 extending from the main body structure 11 to a side of the main body structure 11 away from the flexible display module 200. The connecting assembly 20 is connected to the connecting structure 12.

In the embodiments, the main body structure 11 may be a plate-shaped structure extending in the second direction Y, and the support surface may be a surface of the main body structure 11 proximate to the flexible display module 200.

The number of connecting structures 12 of the bracket 10 may be one or multiple (such as two or three), which is not limited here. In some examples, the bracket 10 includes two connecting structures 12, and the two connecting structures 12 are disposed at two ends of the main body structure 11 in the second direction Y.

In the case where the bracket 10 includes two connecting structures 12, two adjacent brackets 10 may be connected through two connecting assemblies 20.

The connecting structure 12 is connected to the connecting assembly 20, and the main body structure 11 may rotate, with the connecting assembly 20 as an axis, in the set plane along with the connecting structure 12, so as to drive the flexible display module 200 on support surfaces of main body structures 11 to be bent or flattened. That is, a rotation axis of the bracket 10 is located at a side of the bracket 10 away from the flexible display module 200.

As shown in FIG. 1, in the case where the top bracket 10A is provided with the top frame 101, two ends of the top frame 101 may each be connected to a connecting structure 12. In some examples, the top frame 101 and the connecting structure 12 are integrally formed.

As shown in FIGS. 1 to 3, in some embodiments, the connecting structure 12 includes a first connecting portion 121 and a second connecting portion 122 connected to each other. The first connecting portion 121 is used for connecting a second connecting portion 122 in a bracket 10 adjacent thereto, and the second connecting portion 122 is used for connecting a first connecting portion 121 in another bracket 10 adjacent thereto.

A first connecting portion 121 in a bracket 10 is connected to a second connecting portion 122 in another bracket 10 through a connecting assembly 20, and the connecting structure 12 includes both a first connecting portion 121 and a second connecting portion 122. Therefore, one connecting structure 12 may be connected to two brackets 10 through two connecting assemblies 20.

The first connecting portion 121 and the second connecting portion 122 are arranged in a misaligned manner in the first direction X, which may facilitate the connection between the first connecting portion 121 and another bracket 10 and the connection between the second connecting portion 122 and yet another bracket 10. For example, the second connecting portion 122 is located above the first connecting portion 121, which may facilitate the connection between the first connecting portion 121 and a second connecting portion 122 in a lower bracket 10, and may facilitate the connection between the second connecting portion 122 and a first connecting portion 121 in an upper bracket 10.

In some examples, the first connecting portion 121 and the second connecting portion 122 may both protrude outward from the main body structure 11. For example, the first connecting portion 121 protrudes downward (i.e., toward a direction away from the top bracket 10A in the figures) from the main body structure 11, and the second connecting portion 122 protrudes upward (i.e., toward a direction close to the top bracket 10A in the figures) from the main body structure 11. In some other examples, as shown in FIGS. 1 to 3, there is only the second connecting portion 122 protruding outward from the main body structure 11. For example, the second connecting portion 122 protrudes upward from the main body structure 11. Of course, there may be only the first connecting portion 121 protruding outward from the main body structure 11. It is only for illustration here, and should not be regarded as limitations.

As shown in FIGS. 1 to 3, in some embodiments, the first connecting portion 121 and the second connecting portion 122 are arranged in a misaligned manner in the second direction Y. First connecting portions 121 in the plurality of brackets 10 are arranged in the first direction X, and second connecting portions 122 in the plurality of brackets 10 are arranged in the first direction.

The first connecting portion 121 and the second connecting portion 122 are arranged in the misaligned manner in the second direction Y, which may enable a connecting structure 12 to extend into a space of another connecting structure 12 due to the first connecting portion 121 and the second connecting portion 122 being arranged in the misaligned manner. For example, the first connecting portion 121 of the connecting structure 12 is located at a lower right (i.e., a location away from the top bracket 10A and at an outer side of the top bracket 10A in the figure), the second connecting portion 122 is located at an upper left (i.e., a location close to the top bracket 10A and at an inner side of the top bracket 10A in the figure). In this way, the second connecting portion 122 in the lower bracket may be connected to the first connecting portion 121 in a lower left space, and the first connecting portion 121 in the upper bracket may be connected to the second connecting portion 122 in an upper right space.

As shown in FIGS. 1 to 3, first connecting portions 121 of different brackets 10 may be arranged in the first direction X, and similarly, second connecting portions 122 of different brackets 10 may also be arranged in the first direction X.

In this way, a space for the connection between two connecting structures 12 of two adjacent brackets 10 may be reduced, which improves the tightness of connection between the plurality of brackets 10, thereby increasing a density of the support for the flexible display module 200.

As shown in FIG. 1, in some embodiments, one of the first connecting portion 121 and the second connecting portion 122 has a through hole 30, and another one of the first connecting portion 121 and the second connecting portion 122 has a position-limiting hole 40. The connecting assembly 20 includes a pin 21, and the pin 21 passes through the through hole 30 in one bracket 10 and extends into the position-limiting hole 40 in another bracket 10, so that the two adjacent brackets 10 are connected.

As shown in FIG. 1, in some examples, the first connecting portion 121 is located an outer side the second connecting portion 122, the first connecting portion 121 has the through hole 30, and the second connecting portion 122 has the position-limiting hole 40. The pin 21 passes through the through hole 30 of the first connecting portion 121 in the one bracket 10 and extends into the position-limiting hole 40 of the second connecting portion 122 in the another bracket 10, so that the two adjacent brackets are connected. The bracket 10 may rotate by taking the pin 21 as the rotating shaft.

In some examples, the first connecting portion 121 is located at an inner side of the second connecting portion 122, the first connecting portion 121 has the position-limiting hole 40, and the second connecting portion 122 has the through hole 30. The pin 21 passes through the through hole 30 of the second connecting portion 122 in the one bracket 10 and extends into the position-limiting hole 40 of the first connecting portion 121 in the another bracket 10, so that the two adjacent brackets are connected.

In some examples, the first connecting portion 121 is located at the outer side of the second connecting portion 122, the first connecting portion 121 has the position-limiting hole 40, and the second connecting portion 122 has the through hole 30. The pin 21 passes through the through hole 30 of the second connecting portion 122 in the one bracket 10 and extends into the position-limiting hole 40 of the first connecting portion 121 in the another bracket 10, so that the two adjacent brackets are connected.

In some examples, the first connecting portion 121 is located at the inner side of the second connecting portion 122, the first connecting portion 121 has the through hole 30, and the second connecting portion 122 has the position-limiting hole 40. The pin 21 passes through the through hole 30 of the first connecting portion 121 in the one bracket 10 and extends into the position-limiting hole 40 of the second connecting portion 122 in the another bracket 10, so that the two adjacent brackets are connected.

The position-limiting hole 40 may be a through hole or a blind hole, which is not limited here. A movement range of the pin 21 may be limited by the position-limiting hole 40, so that the included angle α formed between the two adjacent brackets 10 is limited within the range of the first angle and the second angle, inclusive.

As shown in FIG. 3, in some embodiments, the position-limit hole 40 is an arc-shaped hole. The pin 21 is capable of moving to a first end 41 of the arc-shaped hole 40 to make the included angle α formed between the two adjacent brackets 10 be at the first angle; and the pin 21 is further capable of moving to a second end 42 of the arc-shaped hole 40 to make the included angle α formed between the two adjacent brackets 10 be at the second angle.

The first end 41 and the second end 42 are two ends of the arc-shaped hole 40, a portion of the pin 21 extending into the arc-shaped hole may move to the first end 41 and the second end 42, and may move between the first end 41 and the second end 42, thereby achieving the rotations of the two adjacent brackets 10.

In the case where the pin 21 is located at the first end 41 of the arc-shaped hole 40, the included angle α between the two adjacent brackets 10 is at the first angle. In the case where the pin 21 is located at the second end 42 of the arc-shaped hole 40, the included angle α between the two adjacent brackets 10 is at the second angle.

As shown in FIGS. 1 to 3, in some embodiments, the connecting assembly 20 further includes an elastic member 22. The elastic member 22 is located between two adjacent brackets 10, two ends of the elastic member 22 arranged facing away from each other are connected to two connecting structures 12, respectively, and the two connecting structures 12 are connected to the same connecting assembly 20 and belong to the two brackets 10.

The two ends of the elastic member 22 are connected to the two connecting structures 12, respectively. When the support structure 100 for the flexible display module is subjected to an external force, the elastic member 22 can be compressed by the pressure from the two connecting structures 12. When the external force subjected to the support structure 100 for the flexible display module is removed, the elastic member 22 can stretch to provide elastic force to the two connecting structures 12, so that the included angle α between the two brackets 10 to which the two connecting structures 12 belong is at the first angle.

In this way, the elastic member 22 can provide the elastic force for the brackets 10 without the external force, so that the included angle α between the two adjacent brackets 10 is at the first angle. As a result, the support surfaces of the plurality of brackets 10 can limit the display surface of the flexible display module 200 to be the flat surface, which improves the supporting performance of the flexible display module 200 performing display in the flat state.

In some embodiments, the elastic member 22 may be a helical spring, or an elastic rubber, or other suitable elastic structures, which is not limited here.

As shown in FIG. 4, in some embodiments, the two first connecting portions 121 connected to the same connecting assembly 20 and belonging to the two brackets 10 are oppositely arranged. The first connecting portion 121 has a groove 13. The end of the elastic member 22 extends into the groove 13.

In the embodiments, the two first connecting portions 121 belonging to the two adjacent brackets 10 are oppositely arranged, and the elastic member 22 is located between the two first connecting portions 121. The first connecting portion 121 has the groove 13. For example, the two first connecting portions 121 oppositely arranged each have the groove 13, and the two ends of the elastic member 22 extend into the two grooves 13, respectively.

In some other embodiments, the second connecting portion 122 may also have a groove 13, so that the elastic member 22 may be connected to the second connecting portion 122, which is not limited here.

As shown in FIGS. 2 and 4, in some embodiments, the first connecting portion 121 includes a first contact portion 123 and a second contact portion 124 extending from the first contact portion 123 to a side of the first contact portion 123 away from the flexible display module 200. An average dimension of the second contact portion 124 in the first direction X is less than an average dimension of the first contact portion 123 in the first direction X.

In the case where the included angle α between the two brackets 10 is at the first angle, two first contact portions 123 belonging to the two brackets 10 may contact with each other, and two second contact portions 124 belonging to the two brackets 10 may be separated from each other. In the case where the included angle α between the two brackets 10 is at the second angle, the two second contact portions 124 belonging to the two brackets 10 may contact with each other, and the two first contact portions 123 belonging to the two brackets 10 may be separated from each other.

As shown in FIGS. 2 and 4, in some embodiments, a dimension of a portion of the second contact portion 124 in the first direction X is inversely proportional to a distance between the portion of the second contact portion 124 and the first contact portion 123. That is, the dimension of the portion of the second contact portion 124 in the first direction X decreases as the distance between the portion of the second contact portion 124 and the first contact portion 123 increases.

As shown in FIG. 4, in some examples, a cross section of the second contact portion 124 in a plane perpendicular to the second direction Y is an isosceles trapezoid. A long base of the trapezoid is close to the first contact portion 123, and a short base of the trapezoid is far away from the first contact portion 123. In this way, a space exists between two second contact portions 124 for rotation. In some examples, in the case where the included angle α between the two brackets 10 is at the second angle, side walls of the two second contact portions 124 belonging to the two brackets 10 are attached to each other, which may also play an auxiliary role in restricting the excessive bending of the two brackets 10.

In some examples, the cross section of the second contact portion 124 in the plane perpendicular to the second direction Y is a semicircle, and a side serving as a diameter of the semicircle is close to the first contact portion 123. In this way, a space exists between two second contact portions 124 for rotation. A side surface of the second contact portion 124 is an arc surface, which can improve the smoothness of the rotations of the two brackets 10.

As shown in FIGS. 2 and 4, in some embodiments, surfaces 125 at two ends of the first contact portion 123 in the first direction X are arc-shaped surfaces.

In a case where the included angle α between two brackets 10 is at the first angle or close to the first angle, surfaces of two first contact portions 123 belonging to two brackets 10 in the first direction X contact with each other. By arranging the surfaces 125, which contact with each other, of the two contact portions 123 to be the arc-shaped surfaces, it is possible to help the two brackets 10 to rotate smoothly, thereby improving the smoothness of bending of the flexible display module 200.

Figure 6:
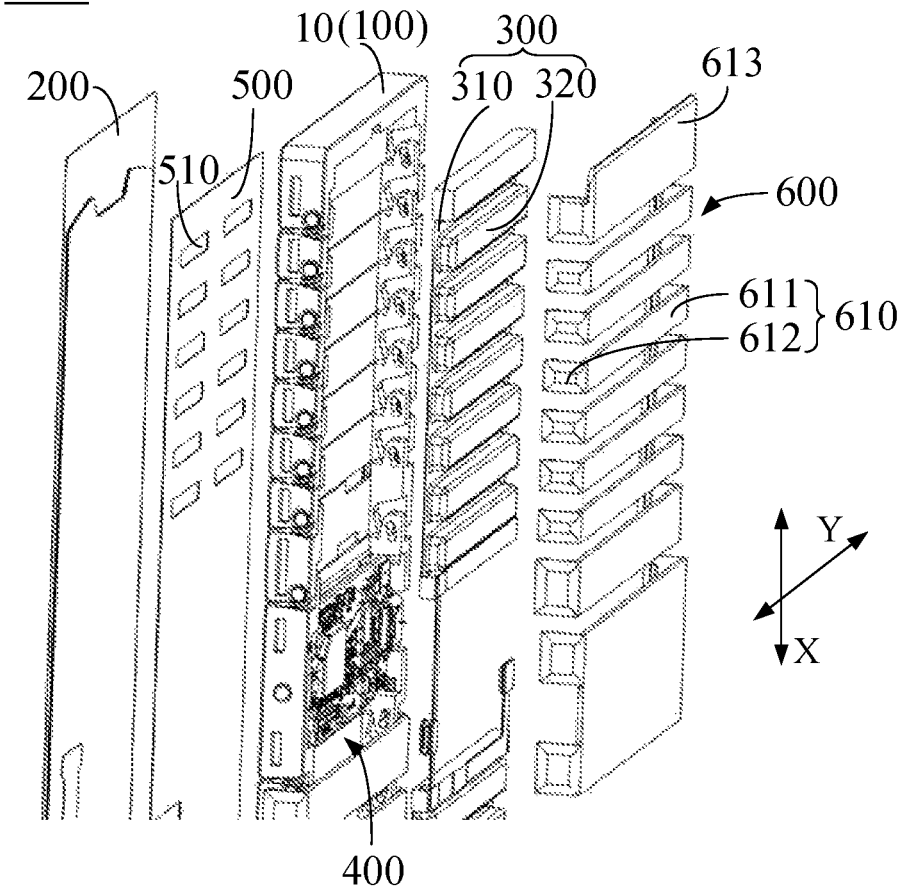
FIG. 6 is a three-dimensional exploded view of a flexible display device, in accordance with some embodiments.

As shown in FIG. 6, embodiments of the present disclosure provide the flexible display device 1000. The flexible display device 1000 includes the support structure 100 for the flexible display module and the flexible display module 200 as described in some embodiments above. The flexible display module 200 is installed on the support surfaces of the plurality of brackets 10 of the support structure 100 for the flexible display module.

The flexible display module 200 may be an electroluminescent display module, such as an organic light-emitting display (OLED) module or a quantum dot light-emitting display (QLED) module. Of course, the flexible display module 200 may also be a mini light-emitting diode (Mini LED) display module or a micro light-emitting diode (Micro LED) display module, which is not limited here.

The flexible display module 200 is driven by the support structure 100 for the flexible display module to realize being flattened or bent.

Since the flexible display device 1000 includes the support structure 100 for the flexible display module, the flexible display device 1000 may have beneficial effects that the support structure 100 for the flexible display module has, and details will not be repeated here.

As shown in FIG. 6, in some embodiments, the flexible display device 1000 further includes a flexible battery 300. The flexible battery 300 is disposed on a side of the support structure 100 for the flexible display module away from the flexible display module 200, and is electrically connected to the flexible display module 200.

The flexible battery 300 includes a connecting plate 310 and a plurality of battery blocks 320 installed on the connecting plate 310. The plurality of battery blocks 320 are sequentially arranged at intervals in the first direction X, and the plurality of battery blocks 320 are connected in series by the connecting plate 310.

The flexible battery 300 is electrically connected to the flexible display module 200, and is used for providing the flexible display module 200 with electrical energy required by the flexible display module 200 for display. For example, the battery block 320 is of an energy storage structure, the connecting plate 310 is provided with circuit traces therein, and the circuit traces are electrically connected to the plurality of battery blocks 320, so that the plurality of battery blocks 320 are connected in series. As a result, the electric energy stored in the battery blocks 320 is output to the flexible display module 200.

The connecting plate 310 is made of a flexible material, so that the connecting plate 310 has flexibility. That is, the connecting plate 310 may be bent, curved, rolled, etc., without damaging its own structure. In this way, in a case where the flexible display module 200 is bent, a shape of the connecting plate 310 can be adaptively adjusted and the flexible display module 200 can be powered.

In some examples, the battery block 320 is located on a side of the connecting plate 310 away from the flexible display module 200.

Figure 7:
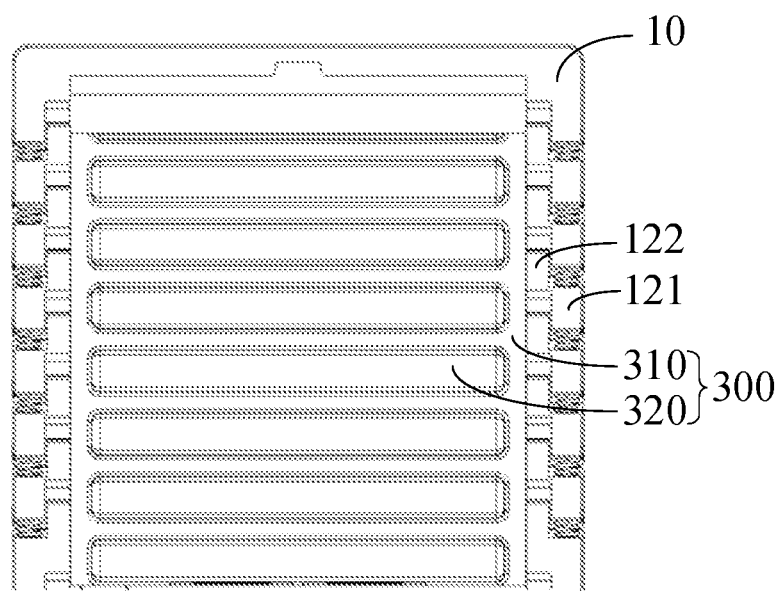
FIG. 7 is a plan view showing locations of a support structure for a flexible display module and a flexible battery of a flexible display device, in accordance with some embodiments.

As shown in FIGS. 6 and 7, in some embodiments, the flexible battery 300 is located inside the support structure 100 for the flexible display module, and is capable of being bent or flattened synchronously along with the support structure 100 for the flexible display module.

The flexible battery 300 may be disposed on a surface of the brackets 10 away from the flexible display module 200. For example, the connecting plate 310 of the flexible battery 300 is bonded onto the surface of the brackets 10 away from the flexible display module 200. Of course, there may be other connection methods, which is not limited here.

In some examples, the number of brackets 10 connected to the flexible battery 300 may be equal to the number of battery blocks 320 of the flexible battery 300. The battery block 320 is disposed opposite to the bracket 10, and a dimension of the bracket 10 in the first direction X may be greater than a dimension of the battery block 320 in the first direction X.

As shown in FIG. 6, in some embodiments, the flexible display device 1000 further includes an integrated circuit board 400. The integrated circuit board 400 is located inside a bracket 10 of the support structure 100 for the flexible display module, and is electrically connected to the flexible display module 200.

The integrated circuit board 400 is electrically connected to the flexible display module 200 to provide the flexible display module 200 with data required by the flexible display module 200 for display, thereby ensuring the normal display of the flexible display module 200. The integrated circuit board 400 may be disposed on a surface of a bracket 10 away from the flexible display module 200. For example, the integrated circuit board 400 is bonded onto the surface of the bracket 10 away from the flexible display module 200. Of course, there may be other connection methods, which is not limited here.

The support structure 100 for the flexible display module may include a bracket 10 with a relatively large dimension in the first direction X to accommodate the integrated circuit board 400. In a process of the support structure 100 for the flexible display module being bent or flattened, the integrated circuit board 200 may rotate along with the bracket 20 connected thereto, but will not be bent.

As shown in FIG. 6, in some embodiments, the flexible display device 1000 further includes a spacer 500. The spacer 500 is located between the flexible display module 200 and the support structure 100 for the flexible display module, so as to provide a smooth support surface for the flexible display module 200.

The spacer 500 may be bonded onto a surface of the support structure 100 for the flexible display module proximate to the flexible display module 200. Of course, there may be other connection methods, which is not limited here.

The spacer 500 has a bendable property, and can be bent and flattened synchronously along with the support structure 100 for the flexible display module.

Since the spacer 500 is of an integrated structure, the bent or flattened spacer can provide a complete and smooth support surface for the flexible display module 200, which improves the reliability of the flexible display module 200 being bent or flattened.

The spacer 500 may be made of a metal material, such as copper (Cu) or aluminum (Al), which is not limited here. A thickness of the spacer 500 may be in a range of 0.1 mm to 0.25 mm, such as 0.1 mm, 0.15 mm, 0.18 mm, 0.2 mm, 0.21 mm, 0.225 mm, 0.23 mm or 0.25 mm. The metal spacer 500 has relatively good thermal conductivity, which can facilitate heat dissipation of the flexible display module 200.

As shown in FIG. 6, in some embodiments, the spacer 500 is provided with a plurality of openings 510 penetrating the spacer 500. By providing the openings 510 in the spacer 500, the force that the spacer 500 is required for being bent can be reduced, which facilitates the spacer 500 being bent. In addition, it can also reduce the resilience of the spacer 500 after being bent, thereby protecting the flexible display module 200.

In some examples, the opening 510 is disposed opposite to a gap between two adjacent brackets 10, which can facilitate the spacer 500 being bent.

As shown in FIG. 6, in some embodiments, the flexible display device 1000 further includes a housing 600. The housing 600 includes a plurality of housing frames 610 arranged at intervals in the first direction X. The housing frames 610 are correspondingly connected to the brackets 10, and the housing 600 is capable of being flattened or bent synchronously along with the support structure 100 for the flexible display module.

The housing 600 is located on the side of the support structure 100 for the flexible display module away from the flexible display module 200. The number of housing frames 610 of the housing 600 may be the same as the number of brackets 10 of the support structure 100 for the flexible display module. In some examples, dimensions of the plurality of brackets 10 in the first direction X may be in one-to-one correspondence with dimensions of the plurality of housing frames 610.

A housing frame 610 is connected to a corresponding bracket 10. When the bracket 10 rotates, the housing frame 610 connected to the bracket 10 rotates synchronously. In this way, the included angle α between two adjacent brackets 10 is substantially equal to an included angle between two housing frames 610 connected to the two brackets 10.

As shown in FIGS. 1 and 6, in some examples, in the case where the bracket 10 includes the top frame 101, a housing frame 610 is further provided with a top plate 613, and an outer contour of the top plate 613 matches an inner contour of the top frame 101.

An accommodating space may be formed between the housing 600 and the support structure 100 for the flexible display module, as shown in FIG. 6, the flexible battery 300 and the integrated circuit board 400 may both be accommodated in the accommodating space.

In some embodiments, the housing frame 610 includes a housing plate 611 and third connecting portion(s) 612 extending from the housing plate 611 to a side of the housing plate 611 proximate to the support structure 100 for the flexible display module.

The housing plate 611 may be of a plate-shaped structure extending in the second direction Y, and disposed substantially parallel to the support surface of the bracket 10. The third connecting portion 612 may be formed extending from an end of the housing plate 611 in the second direction Y to the side of the housing plate 611 proximate to the support structure 100 for the flexible display module.

As shown in FIG. 6, in some embodiments, the third connecting portion 612 has one of a slot and a buckle, and an outer wall of the bracket 10 has another one of the slot and the buckle. The third connecting portion 612 and the bracket 10 are connected in a snap-fit manner.

The third connecting portion 612 may have the slot, and the outer wall of the bracket 10 has the buckle. Alternatively, the third connecting portion 612 may have the buckle, and the outer wall of the bracket 10 has the slot. The buckle and the slot are connected in the snap-fit manner, so that the third connecting portion 612 and the bracket 10 are connected.

In some examples, the first connecting portion 121 is located at the outer side of the second connecting portion 122. That is, an outer wall of the first connecting portion 121 is the outer wall of the bracket 10. The buckle is disposed on the third connecting portion 612, is connected to the slot disposed in the outer wall of the first connecting portion 121 in the snap-fit manner, so that the third connecting portion 612 and the bracket 10 are connected.

The foregoing descriptions are merely specific implementations of the present 10 disclosure, but the protection scope of the present disclosure is not limited thereto. Any changes or replacements that a person skilled in the art could readily conceive of within the technical scope of the present disclosure shall be included in the protection scope of the present disclosure. Therefore, the protection scope of the present disclosure shall be subject to the protection scope of the claims.

What is claimed is:

1. A support structure for a flexible display module, comprising:
a plurality of brackets sequentially arranged in a first direction, the plurality of brackets each extending in a second direction, the second direction intersecting the first direction;
at least one connecting assembly, a connecting assembly of the at least one connecting assembly being connected to two adjacent brackets of the plurality of brackets, so that the two adjacent brackets are capable of rotating with each other in a set plane; the set plane being perpendicular to the second direction, wherein
the connecting assembly is configured to limit an included angle formed between the two adjacent brackets to be within a range of a first angle to a second angle, inclusive;
support surfaces of the plurality of brackets are capable of supporting the flexible display module; in a case where the included angle formed between the two adjacent brackets is at the first angle, the support surfaces of the plurality of brackets are capable of limiting a display surface of the flexible display module to be a flat surface; and in a case where the included angle formed between the two adjacent brackets is at the second angle, the support surfaces of the plurality of brackets are capable of limiting the display surface of the flexible display module to be a curved surface;
the plurality of brackets each include a main body structure and a connecting structure extending from the main body structure to a side of the main body structure away from the support surfaces; and
the connecting assembly is connected to connecting structures of the two adjacent brackets, wherein the connecting structure includes a first connecting portion and a second connecting portion connected to each other, and the first connecting portion and the second connecting portion are arranged in a misaligned manner in the first direction;

the first connecting portion is used for connecting a second connecting portion in one bracket adjacent thereto, and the second connecting portion is used for connecting to a first connecting portion in another bracket adjacent thereto; and the first connecting portion includes a first contact portion and a second contact portion extending from the first contact portion to a side of the first contact portion away from the support surfaces: a dimension of a portion of the second contact portion in the first direction is inversely proportional to a distance between the portion of the second contact portion and the first contact portion.

2. The support structure for the flexible display module according to claim 1, wherein the first connection portion and the second connection portion are arranged in a misaligned manner in the second direction;

first connecting portions of the plurality of brackets are arranged in the first direction; and second connecting portions of the plurality of brackets are arranged in the first direction.

3. The support structure for the flexible display module according to claim 1, wherein one of the first connecting portion and the second connecting portion has a through hole, and another one of the first connecting portion and the second connecting portion has a position-limiting hole;

the connecting assembly includes a pin, and the pin passes through a through hole in one bracket and extends into a position-limiting hole in another bracket, so that the two adjacent brackets are connected.

4. The support structure for the flexible display module according to claim 3, wherein the position-limiting hole is an arc-shaped hole;

the pin is capable of moving to a first end of the arc-shaped hole to make the included angle formed between the two adjacent brackets be at the first angle; and the pin is further capable of moving to a second end of the arc-shaped hole to make the included angle formed between the two adjacent brackets be at the second angle.

5. The support structure for the flexible display module according to claim 1, wherein the connecting assembly includes an elastic member;

the elastic member is located between the two adjacent brackets, and two ends of the elastic member arranged facing away from each other are connected to two connecting structures, respectively, the two connecting structures being connected to a same connecting assembly of the at least one connecting assembly and belonging to the two brackets.

6. The support structure for the flexible display module according to claim 5, wherein the two first connecting portions connected to the same connecting assembly and belonging to the two brackets are oppositely arranged; a first connecting portion in the two first connecting portions has a groove; and an end in the two ends of the elastic member extends into the groove.

7. The support structure for the flexible display module according to claim 1, wherein the second connecting portion protrudes outward from the main body structure.

8. The support structure for the flexible display module according to claim 1, wherein surfaces of the first contact portion at both ends in the first direction are arc-shaped surfaces.

9. The support structure for the flexible display module according to claim 1, wherein an angle difference between the first angle and the second angle is less than or equal to 30°.

10. A flexible display device, comprising:

the support structure according to claim 1; and the flexible display module installed on the support surfaces of the plurality of brackets of the support structure.

11. The flexible display device according to claim 10, further comprising:

a flexible battery, the flexible battery being disposed on a side of the support structure away from the flexible display module, and being electrically connected to the flexible display module, wherein the flexible battery includes a connecting plate and a plurality of battery blocks installed on the connecting plate; the plurality of battery blocks are sequentially arranged at intervals in the first direction, and the plurality of battery blocks are connected in series by the connecting plate; and the flexible battery is located inside the support structure and is capable of being bent or flattened synchronously along with the support structure.

12. The flexible display device according to claim 10, further comprising:

an integrated circuit board located inside a bracket in the plurality of brackets of the support structure and electrically connected to the flexible display module.

13. The flexible display device according to claim 10, further comprising:

a spacer, wherein the spacer is located between the flexible display module and the support structure, so as to provide a smooth support surface for the flexible display module; and the spacer is provided with a plurality of openings penetrating the spacer.

14. The flexible display device according to claim 10, further comprising:

a housing including a plurality of housing frames arranged at intervals in the first direction, wherein the plurality of housing frames are correspondingly connected to the plurality of brackets; the housing is capable of being flattened or bent synchronously along with the support structure, wherein a housing frame in the plurality of housing frames includes a housing plate, and a third connecting portion extending from the housing plate to a side of the housing plate proximate to the support structure; and the third connecting portion has one of a slot and a buckle, and an outer wall of a corresponding bracket has another one of the slot and the buckle; the third connecting portion and the bracket are connected in a snap-fit manner.

15. A support structure for a flexible display module, comprising:

a plurality of brackets sequentially arranged in a first direction, the plurality of brackets each extending in a second direction, the second direction intersecting the first direction;

at least one connecting assembly, a connecting assembly of the at least one connecting assembly being connected to two adjacent brackets of the plurality of brackets, so that the two adjacent brackets are capable of rotating with each other in a set plane; the set plane being perpendicular to the second direction, wherein the connecting assembly is configured to limit an included angle formed between the two adjacent brackets to be within a range of a first angle to a second angle, inclusive;

support surfaces of the plurality of brackets are capable of supporting the flexible display module; in a case where the included angle formed between the two adjacent brackets is at the first angle, the support surfaces of the plurality of brackets are capable of limiting a display surface of the flexible display module to be a flat surface; and in a case where the included angle formed between the two adjacent brackets is at the second angle, the support surfaces of the plurality of brackets are capable of limiting the display surface of the flexible display module to be a curved surface;

the plurality of brackets each include a main body structure and a connecting structure extending from the main body structure to a side of the main body structure away from the support surfaces; and the connecting assembly is connected to connecting structures of the two adjacent brackets, wherein the connecting structure includes a first connecting portion and a second connecting portion connected to each other, and the first connecting portion and the second connecting portion are arranged in a misaligned manner in the first direction;

the first connecting portion is used for connecting a second connecting portion in one bracket adjacent thereto, and the second connecting portion is used for connecting to a first connecting portion in another bracket adjacent thereto;

one of the first connecting portion and the second connecting portion has a through hole, and another one of the first connecting portion and the second connecting portion has a position-limiting hole; and the connecting assembly includes a pin, and the pin passes through a through hole in one bracket and extends into a position-limiting hole in another bracket, so that the two adjacent brackets are connected, wherein the position-limiting hole is an arc-shaped hole; and the pin is capable of moving to a first end of the arc-shaped hole to make the included angle formed between the two adjacent brackets be at the first angle; and the pin is further capable of moving to a second end of the arc-shaped hole to make the included angle formed between the two adjacent brackets be at the second angle.

16. The support structure for the flexible display module according to claim 15, wherein the connecting assembly includes an elastic member;

the elastic member is located between the two adjacent brackets, and two ends of the elastic member arranged facing away from each other are connected to two connecting structures, respectively, the two connecting structures being connected to a same connecting assembly of the at least one connecting assembly and belonging to the two brackets.

17. A flexible display device, comprising:
the support structure according to claim 15; and
the flexible display module installed on the support surfaces of the plurality of brackets of the support structure.

18. A support structure for a flexible display module, comprising:
a plurality of brackets sequentially arranged in a first direction, the plurality of brackets each extending in a second direction, the second direction intersecting the first direction;

at least one connecting assembly, a connecting assembly of the at least one connecting assembly being connected to two adjacent brackets of the plurality of brackets, so that the two adjacent brackets are capable of rotating with each other in a set plane; the set plane being perpendicular to the second direction, wherein the connecting assembly is configured to limit an included angle formed between the two adjacent brackets to be within a range of a first angle to a second angle, inclusive;

support surfaces of the plurality of brackets are capable of supporting the flexible display module; in a case where the included angle formed between the two adjacent brackets is at the first angle, the support surfaces of the plurality of brackets are capable of limiting a display surface of the flexible display module to be a flat surface; and in a case where the included angle formed between the two adjacent brackets is at the second angle, the support surfaces of the plurality of brackets are capable of limiting the display surface of the flexible display module to be a curved surface;

the plurality of brackets each include a main body structure and a connecting structure extending from the main body structure to a side of the main body structure away from the support surfaces; and the connecting assembly is connected to connecting structures of the two adjacent brackets, wherein the connecting structure includes a first connecting portion and a second connecting portion connected to each other, and the first connecting portion and the second connecting portion are arranged in a misaligned manner in the first direction;

the first connecting portion is used for connecting a second connecting portion in one bracket adjacent thereto, and the second connecting portion is used for connecting to a first connecting portion in another bracket adjacent thereto;

the connecting assembly includes an elastic member; and the elastic member is located between the two adjacent brackets, and two ends of the elastic member arranged facing away from each other are connected to two connecting structures, respectively, the two connecting structures being connected to a same connecting assembly of the at least one connecting assembly and belonging to the two brackets; and the two first connecting portions connected to the same connecting assembly and belonging to the two brackets are oppositely arranged; a first connecting portion in the two first connecting portions has a groove; and an end in the two ends of the elastic member extends into the groove.

19. The support structure for the flexible display module according to claim 18, wherein the second connecting portion protrudes outward from the main body structure.

20. A flexible display device, comprising:
the support structure according to claim 18; and
the flexible display module installed on the support surfaces of the plurality of brackets of the support structure.

* * * * *